US012588328B2

(12) United States Patent
Iizuka et al.

(10) Patent No.: US 12,588,328 B2
(45) Date of Patent: Mar. 24, 2026

(54) INFRARED LED ELEMENT

(71) Applicant: Ushio Denki Kabushiki Kaisha, Tokyo (JP)

(72) Inventors: Kazuyuki Iizuka, Tokyo (JP); Toru Sugiyama, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 451 days.

(21) Appl. No.: 18/043,295

(22) PCT Filed: Aug. 26, 2021

(86) PCT No.: PCT/JP2021/031339
§ 371 (c)(1),
(2) Date: Feb. 27, 2023

(87) PCT Pub. No.: WO2022/059450
PCT Pub. Date: Mar. 24, 2022

(65) Prior Publication Data
US 2023/0327052 A1 Oct. 12, 2023

(30) Foreign Application Priority Data
Sep. 16, 2020 (JP) ................................. 2020-155631

(51) Int. Cl.
*H10H 20/831* (2025.01)
*H10H 20/01* (2025.01)
(Continued)

(52) U.S. Cl.
CPC .... *H10H 20/8316* (2025.01); *H10H 20/0133* (2025.01); *H10H 20/824* (2025.01); *H10H 20/832* (2025.01); *H10H 20/856* (2025.01)

(58) Field of Classification Search
CPC ................................................. H10H 20/824
See application file for complete search history.

(56) References Cited

U.S. PATENT DOCUMENTS

2008/0093612 A1* 4/2008 Konno ................... H10H 20/82
257/E33.068
2008/0173885 A1 7/2008 Kuromizu
(Continued)

FOREIGN PATENT DOCUMENTS

JP 2554852 B2 11/1996
JP 2716774 B2 2/1998
(Continued)

OTHER PUBLICATIONS

International Search Report issued in PCT/JP2021/031339; mailed Oct. 26, 2021.
(Continued)

*Primary Examiner* — Ajay Ojha
*Assistant Examiner* — Hajar Kolahdouzan
(74) *Attorney, Agent, or Firm* — Studebaker Brackett PLLC

(57) ABSTRACT

Provided are an infrared LED element with an emission wavelength of 1000 nm or more, which has improved emission efficiency by enhancing uniformity of light emission in a surface direction.

The infrared LED element includes: a support substrate; a reflection layer formed on top of the support substrate; an insulating layer formed on top of the reflection layer; a contact layer formed on top of the insulating layer, the contact layer being made of $Ga_xIn_{1-x}As_yP_{1-y}$ ($0 \leq x < 0.33$, $0 \leq y < 0.70$) of a first conduction type; a first cladding layer of the first conduction type, the first cladding layer being formed on top of the contact layer; an active layer formed on top of the first cladding layer; a second cladding layer of a second conduction type being formed on top of the active layer; a first electrode formed at each of a plurality of places in the insulating layer by passing through the insulating layer in a first direction orthogonal to a main surface of the (Continued)

support substrate, the first electrode connecting the contact layer to the reflection layer; and a second electrode formed on top of the second cladding layer.

10 Claims, 9 Drawing Sheets

(51) Int. Cl.
    *H10H 20/824*      (2025.01)
    *H10H 20/832*      (2025.01)
    *H10H 20/856*      (2025.01)

(56)             References Cited

U.S. PATENT DOCUMENTS

| | | | | |
|---|---|---|---|---|
| 2013/0228744 | A1 | 9/2013 | Kazama | |
| 2018/0219131 | A1* | 8/2018 | Park | H10H 20/853 |
| 2020/0381589 | A1* | 12/2020 | Yamamoto | H10H 20/824 |

FOREIGN PATENT DOCUMENTS

| | | |
|---|---|---|
| JP | 2007-221029 A | 8/2007 |
| JP | 2008-283096 A | 11/2008 |
| JP | 2012-129357 A | 7/2012 |
| JP | 2013-201411 A | 10/2013 |
| JP | 6617218 B1 | 12/2019 |
| WO | 2019/124497 A1 | 6/2019 |

OTHER PUBLICATIONS

"Notice of Reasons for Refusal" Office Action issued in JP 2020-155631; mailed by the Japanese Patent Office on Jan. 21, 2025.

An Office Action; "Notice of Reasons for Refusal," mailed by the Japanese Patent Office on Jan. 5, 2024, which corresponds to Japanese Patent Application No. 2020-155631 and is related to U.S. Appl. No. 18/043,295; with English language translation.

Notification of Transmittal of Translation of the International Preliminary Report on Patentability and Translation of Written Opinion of the International Searching Authority; PCT/JP2021/031339; mailed on Mar. 30, 2023.

An Office Action; "Notice of Reasons for Refusal," mailed by the Japanese Patent Office on Jun. 18, 2024, which corresponds to Japanese Patent Application No. 2020-155631 and is related to U.S. Appl. No. 18/043,295; with English language translation.

* cited by examiner x = 0.38

32

31 (31a)

31 (31b)

x = 0.15

32

31

31

Spectrum with Peak Wavelength 1200 nm

INFRARED LED ELEMENT

TECHNICAL FIELD

The present invention relates to an infrared LED element and particularly relates to an infrared LED element having an emission wavelength of 1000 nm or more.

BACKGROUND ART

In recent years, semiconductor light-emitting elements having an emission wavelength in an infrared region of wavelengths of 1000 nm or more have been used for a wide variety of applications such as surveillance or monitoring cameras, gas detectors, medical sensors, and industrial equipment.

A semiconductor light-emitting element having an emission wavelength of 1000 nm or more is generally manufactured through the following procedure. A semiconductor layer of a first conduction type, an active layer (sometimes referred to as a "luminous layer"), and a semiconductor layer of a second conduction type are epitaxially grown in sequence on an indium phosphide (InP) substrate that acts as a growth substrate, and then an electrode for current injection is formed on the semiconductor wafer. After that, the semiconductor wafer is cut into a chip-shaped element.

Previously, in terms of a semiconductor light-emitting element having an emission wavelength of 1000 nm or more, semiconductor laser elements had been developed ahead of other semiconductor light-emitting elements. Meanwhile, the development of LED elements had not been advanced compared to laser elements because of very few applications of LED elements.

However, in recent years, in response to the expansion of the range of applications, demand for infrared LED element products with increased efficiency has been growing. Patent Document 1 discloses an infrared LED element in which a wafer includes a crystal-grown LED structure on an InP substrate and electrodes formed on upper and lower surfaces of the wafer, for example. By applying a voltage across both of the electrodes and thereby injecting an electric current into an active layer, the infrared LED element emits light. Patent Document 2 discloses a structure in which a wafer includes a crystal-grown epitaxial semiconductor layer that has an LED structure on a growth substrate, for example. By joining the wafer to a support substrate through a high reflection layer and then making the growth substrate into a thin film or completely removing the growth substrate, the disclosed structure provides improved light extraction efficiency.

PRIOR ART DOCUMENT

Patent Documents

Patent Document 1: JP 6617218 B2
Patent Document 2: JP-A-2012-129357

SUMMARY OF THE INVENTION

Problems to be Solved by the Invention

The inventors of the present invention made a plurality of LED elements that each provide high light extraction efficiency and have a structure in which a wafer and a support substrate are bonded together as described in Patent Document 2. The inventors examined the LED elements and observed a phenomenon of uneven light emission inside an LED chip of the infrared LED elements that have an emission wavelength of 1000 nm or more. When such a phenomenon occurs, problems, such as a decrease in light emission efficiency and shortened lifetime caused by the concentration of an electric current only in a partial region, occur and thus this phenomenon is unfavorable.

Given the above problems, an object of the present invention is to improve efficiency in light emission of an infrared LED element that has an emission wavelength of 1000 nm or more by enhancing uniformity of the light emission in a surface direction.

Means for Solving the Problems

An infrared LED element according to the present invention, having a peak wavelength in a range from 1000 nm to 2000 nm inclusive, includes:

a support substrate that exhibits electrical conductivity;

a reflection layer formed on top of the support substrate, the reflection layer being made of a metallic material;

an insulating layer formed on top of the reflection layer;

a contact layer formed on top of the insulating layer, the contact layer being made of $Ga_xIn_{1-x}As_yP_{1-y}$ of a first conduction type, where $0 \leq x < 0.33$ and $0 \leq y < 0.70$;

a first cladding layer of the first conduction type, the first cladding layer being formed on top of the contact layer;

an active layer formed on top of the first cladding layer;

a second cladding layer of a second conduction type different from the first conduction type, the second cladding layer being formed on top of the active layer;

a first electrode formed in a partial zone of the insulating layer by passing through the insulating layer in a first direction orthogonal to a main surface of the support substrate, the first electrode connecting the contact layer to the reflection layer; and a second electrode formed on top of the second cladding layer.

In order to manufacture an infrared LED element having a peak wavelength in a range from 1000 nm to 2000 nm inclusive, it is necessary to use an InP substrate as a growth substrate and epitaxially grow a semiconductor layer made of a material that is lattice matched to the growth substrate. Examples of such a material include InP, GaInAsP, AlGaInAs, AlInAs, and InGaAs.

In the present specification, the "peak wavelength" refers to a wavelength at which light output is highest in an emission spectrum. In the present specification, the expression "GaInAsP" represents a mixed crystal composed of Ga, In, As, and P and is a simple description from which a composition ratio is omitted. The same applies to other expressions such as "AlGaInAs".

The reflection layer is disposed to reflect a light beam out of light emitted from the active layer, the light beam traveling to a side (toward the support substrate) opposite a light extraction surface (a second cladding layer side) and causing the reflected light beam to travel to the light extraction surface. With this in view, it is preferred that the reflection layer is made of a metallic material with high reflectance to the light being emitted from the active layer and having a wavelength of 1000 nm to 2000 nm. The reflectance is preferably 70% or higher, more preferably 80% or higher, and particularly preferably 90% or higher. The material for such a reflection layer may be, for example, a material, such as Ag, an Ag alloy, Au, Al, or Cu.

Meanwhile, if the reflection layer is simply intended to return the light beam traveling toward the support substrate to the light extraction surface, a structure in which the reflection layer is put into direct contact with an entire surface of the contact layer may be possibly used. However, the contact layer made of a semiconductor material and the reflection layer made of a metallic material need to be treated by heat to reduce the contact resistance between the two layers. When the contact layer made of a semiconductor material that can be lattice matched to InP and the reflection layer made of a metallic material are put into contact with each other and treated by heat, the metallic material making up the reflection layer and the contact layer is rendered into an alloy, resulting in a decrease in reflectance. With this in view, the reflection layer cannot be put into direct contact with the contact layer. Hence, from the viewpoint of ensuring an electrical connection between the reflection layer and the contact layer, the first electrode is disposed, as in the structure described above, to connect the contact layer to the reflection layer.

The first electrode is made of a material that is readily rendered into an alloy together with the contact layer to provide low contact resistance despite lower reflectance than that of the reflection layer. In one example, the first electrode may have a structure such as an AuZn, AuBe, or Au/Zn/Au layer structure.

As described above, the reflectance of the first electrode is lower than that of the reflection layer. Thus, light extraction efficiency is substantially decreased if an interface electrode is formed on a substantially entire surface in a direction along a surface of the support substrate. Hence, in the infrared LED element according to the present invention, the insulating layer is disposed between the reflection layer and the contact layer, and the first electrode is formed in a partial zone in the direction along the surface to connect contact layer to the reflection layer by passing through the insulating layer.

A material such as $SiO_2$, SiN, or $Al_2O_3$ can be used for the insulating layer. Since these materials exhibit high thermal stability, chemistry of the insulating layer scarcely changes even when heat treatment is applied to reduce the contact resistance between the contact layer and the first electrode. Any of these materials display a high value of 90% or greater in transmittance to light having a wavelength of 1000 nm to 2000 nm inclusive. Thus, the light beam being emitted from the active layer and traveling toward the support substrate passes through a zone in which the first electrode is not formed in the insulating layer and is subsequently reflected off the reflection layer formed below the insulating layer and is introduced to the light extraction surface.

From the viewpoint of improving light extraction efficiency, an area of the zone throughout which the first electrode is formed is preferably made as small as possible in a direction parallel to the main surface of the support substrate (hereinafter simply referred to as a "surface direction"). On the other hand, if the area is too small, a path for an electric current flowing in the semiconductor layer is concentrated in a partial place, and resistance increases. With this in view, the first electrode is formed at each of a plurality of places dispersed in the surface direction.

Preferably, the contact layer is made of a material whose resistivity is as low as possible from the viewpoint of decreasing contact resistance to the first electrode made of a metallic material as low as possible. Of the above materials that can be lattice matched to the growth substrate made of InP, AlGaInAs and AlInAs are materials that contain Al, and when these materials are manufactured or during continued use of these materials, the resistivity may increase since Al is apt to be oxidized. InGaAs does not provide high light extraction efficiency because an absorption edge wavelength of InGaAs is longer than or close to the peak wavelength described above and thus a ratio in which the light emitted from the active layer is absorbed in the contact layer increases. With this in view, it is preferred that the contact layer included in the infrared LED element according to the present invention is made of InP or GaInAsP.

According to the present inventors' diligent research, when infrared LED elements including contact layers with varied Ga and In compositions were fabricated and actually emitted light, it was confirmed that variation in light emission was observed depending on the composition. The inventors have now found that if the contact layer is made of $Ga_xIn_{1-x}As_yP_{1-y}$ ($0 \leq x < 0.33$, $0 \leq y < 0.70$), such light emission variation can be reduced. This point will be described later in the section of "MODE FOR CARRYING OUT THE INVENTION".

A gross area of a zone throughout which the first electrode is formed at each of the plurality of the places is preferably 30% or lower, more preferably 20% or lower, and particularly preferably 15% or lower relative to an area of the active layer.

According to the configuration described above, a decrease in light extraction efficiency can be suppressed and light emission variation in the surface direction can be reduced with a decrease in the gross area of the zone throughout which the first electrode is formed.

The infrared LED element may have a peak wavelength in a range of 1000 nm or more and less than 1200 nm, and the contact layer may be made of $Ga_xIn_{1-x}As_yP_{1-y}$, where $0 \leq x < 0.14$ and $0 \leq y < 0.30$.

In response to an increase in the Ga composition of the contact layer, in other words, an increase in the value of x in $Ga_xIn_{1-x}As_yP_{1-y}$, a wavelength at an absorption edge (a wavelength corresponding to the band gap energy) in the spectrum of the contact layer shifts to a long-wavelength side. When the absorption edge wavelength approaches the peak wavelength, a ratio at which light emitted from the active layer is absorbed by the contact layer increases. This is unfavorable from the viewpoint of improving light extraction efficiency.

Thus, when the peak wavelength of the infrared LED element is in a range of 1000 nm or more and less than 1200 nm, the value of x indicating the Ga composition of the contact layer is preferably in the range, $0 \leq x < 0.14$.

As described above, the semiconductor layers included in the infrared LED element are required to epitaxially grow on the growth substrate made of InP, and thus the semiconductor layers need to have compositions that are lattice matched to InP. Hence, fora contact layer made of $Ga_xIn_{1-x}As_yP_{1-y}$ ($0 \leq x < 0.33$, $0 \leq y < 0.70$), an increase in the Ga composition (the value of x) inevitably leads to an increase in the As composition (the value of y). Conversely, a decrease in the Ga composition (the value of x) inevitably leads to a decrease in the As composition (the value of y). From the viewpoint of lattice matching, when the value of x indicating the Ga composition of the contact layer is $0 \leq x < 0.14$, the value of y indicating the As composition is preferably in the range, $0 \leq y < 0.30$.

The infrared LED element may have a peak wavelength in a range from 1200 nm to 2000 nm inclusive, and the contact layer may be made of $Ga_xIn_{1-x}As_yP_{1-y}$, where $0.14 \leq x < 0.33$ and $0.30 \leq y < 0.70$.

For the peak wavelength in a range from 1200 nm to 2000 nm inclusive, even when the value of x indicating the Ga composition is $0.14 \leq x < 0.33$, light absorption in the contact layer hardly needs to be taken into account. Meanwhile, intensive research by the inventors of the present invention has found that contact resistance can be reduced with an increase in the Ga composition. With this in view, when the peak wavelength ranges from 1200 nm to 2000 nm inclusive, the Ga composition preferably satisfies $0.14 \leq x < 0.33$ by being higher than that for the peak wavelength in a range of 1000 nm or more and less than 1200 nm. Then, in this case, from the viewpoint of lattice matching, the value of y indicating the As composition is preferably in the range, $0.30 \leq y < 0.70$.

From the viewpoint described above, a material for the contact layer is preferably selected such that the absorption edge wavelength of the contact layer is shorter than the peak wavelength by 100 nm or more.

The first conduction type may be a p-type, and the second conduction type may be an n-type.

In order to improve light extraction efficiency, the infrared LED element preferably has a structure in which light emission is hindered immediately below an electrode (surface electrode) formed adjacent to the light extraction surface. Specifically, when considering a current path between the second electrode (surface electrode) and the first electrode (interface electrode), current dispersion in the cladding layer on the second electrode side viewed from the active layer makes it possible to suppress light emission directly below the second electrode. To implement such a current path, the resistance of a cladding layer, i.e., the second cladding layer, on the side of the active layer adjacent to the light extraction surface needs to be lower than the resistance of a cladding layer, i.e., the first cladding layer on a side of the active layer adjacent to the reflection layer. Semiconductors of the n-type are apt to implement low resistance compared to semiconductors of the p-type. Thus, when the second cladding layer located on the light extraction surface side is of the n-type and the first cladding layer is of the p-type, light emission immediately below the second electrode is suppressed to further improve light extraction efficiency.

Effect of the Invention

According to the present invention, an infrared LED element is implemented that has an emission wavelength of 1000 nm or more and that provides enhanced uniformity of light emission in a surface direction.

MODE FOR CARRYING OUT THE INVENTION

Figure 1:
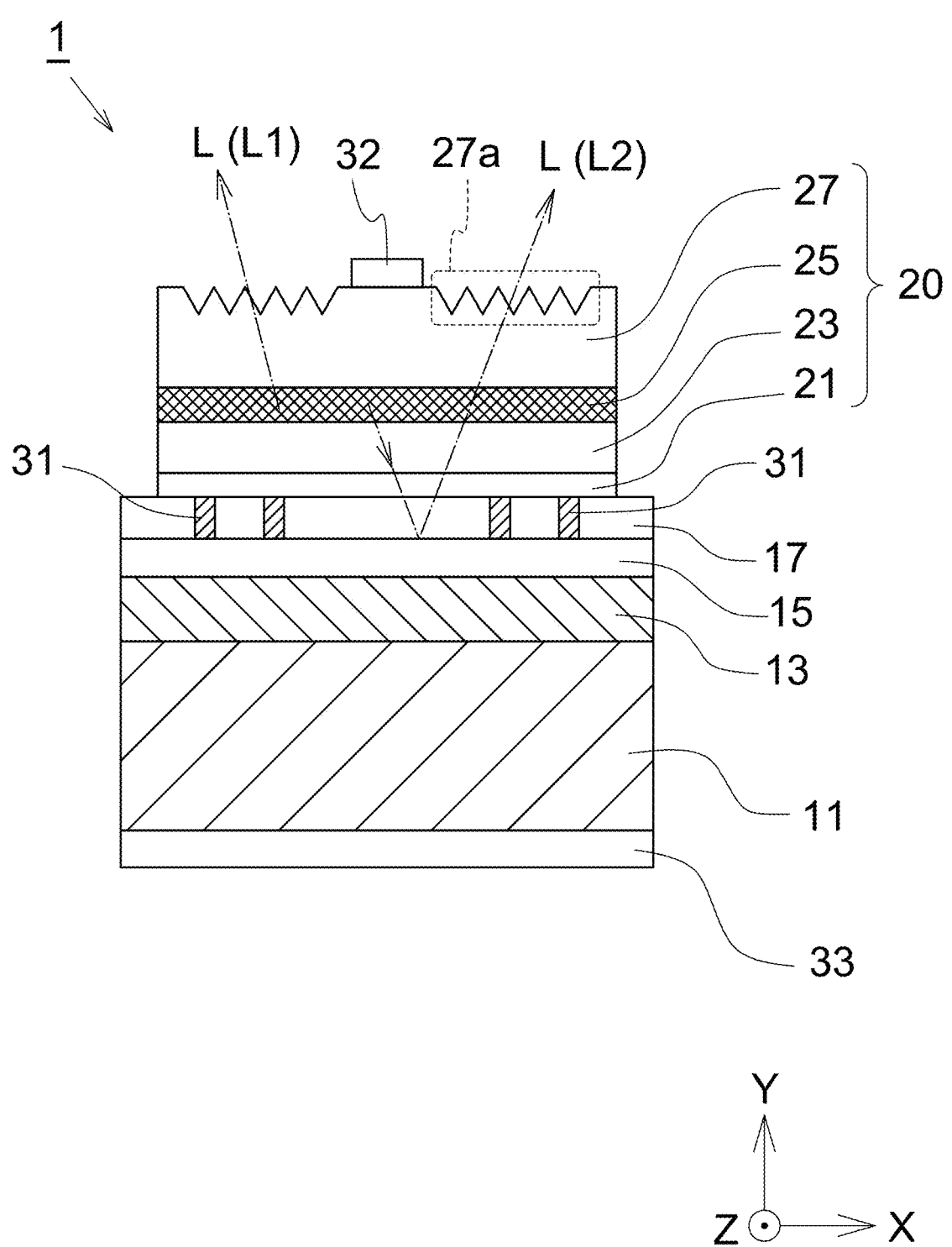
FIG. 1 is a cross-sectional view schematically showing a structure of an embodiment of an infrared LED element according to the present invention.

An embodiment of an infrared LED element according to the present invention will be described with reference to the drawings. The drawings referred to below are schematic illustrations and the dimensional ratios in the drawings are not necessarily the same as the actual dimensional ratios. Furthermore, the dimensional ratios may not always be the same between the drawings.

In the present specification, the expression "a layer B is formed on top of a layer A" is intended to include a case in which the layer B is formed over a surface of the layer A through a thin film, as well as a case in which the layer B is formed directly on the surface of the layer A. The "thin film" referred to herein may indicate a layer having a film thickness of 10 nm or less and preferably a layer having a film thickness of 5 nm or less.

FIG. 1 is a cross-sectional view schematically showing a structure of an infrared LED element of the present embodiment. An infrared LED element 1 shown in FIG. 1 includes a semiconductor layer 20 formed on top of a support substrate 11. The infrared LED element 1 shown in FIG. 1 is equivalent to a schematic cross-sectional view of the infrared LED element that is cut at a predetermined place along an XY plane. In the description given hereinafter, reference is made as appropriate to an XYZ coordinate system added to FIG. 1.

In the following description, in the case of distinguishing whether the direction is positive or negative, the positive or negative symbol is added, such as the "+X direction" or the "−X direction". In the case where there is no need to distinguish between positive and negative directions, the direction is simply described as the "X direction". Namely, in the present specification, in the case where the direction is simply described as the "X direction", both "+X direction" and "−X direction" are included. The same applies to the Y direction and the Z direction.

In the infrared LED element 1 shown in FIG. 1, infrared light L (L1, L2) generated in the semiconductor layer 20 (more specifically, in an active layer 25 described later) is extracted in the +Y direction with respect to the active layer 25. The infrared light L is light having a peak wavelength ranging from 1000 nm to 2000 nm inclusive.

[Element Structure]

A structure of the infrared LED element 1 will now be described in detail.

(Support Substrate 11)

The support substrate 11 is made of an electrically conductive material such as Si, InP, Ge, GaAs, SiC, or CuW. From the viewpoint of heat discharge property and manufacturing costs, the material is preferably Si. A thickness (a length in the Y direction) of the support substrate 11 is not particularly limited, but ranges from 50 $\mu$m 10 to 500 $\mu$m inclusive, for example, and preferably ranges from 100 $\mu$m to 300 $\mu$m inclusive.

(Joining Layer 13)

The infrared LED element 1 shown in FIG. 1 includes a joining layer 13. The joining layer 13 is made of a low-melting soldering material such as Au, Au—Zn, Au—Sn, Au—In, Au—Cu—Sn, Cu—Sn, Pd—Sn, Sn, or the like. The semiconductor layer 20 is formed on an upper surface of a growth substrate 3, and the joining layer 13 is used to bond the growth substrate 3 and the support substrate 11 together, as described later with reference to FIG. 2E. A thickness of the joining layer 13 is not particularly limited, but ranges from 0.5 $\mu$m to 5.0 $\mu$m inclusive, for example, and preferably ranges from 1.0 $\mu$m to 3.0 $\mu$m inclusive.

(Reflection Layer 15)

The infrared LED element 1 shown in FIG. 1 includes a reflection layer 15 formed on top of the joining layer 13. The reflection layer 15 performs a function of reflecting the infrared light L2 that travels toward the support substrate 11 (−Y direction) out of the infrared light L generated in the active layer 25 and directing it in the +Y direction. The reflection layer 15 is made of an electrically conductive material that displays high reflectance to the infrared light L. The reflectance of the reflection layer 15 to the infrared light L is preferably 70% or higher, more preferably 80% or higher, and particularly preferably 90% or higher. In case the peak wavelength of the infrared light L ranges from 1000 nm to 2000 nm inclusive, the reflection layer 15 can be made of a metallic material such as Ag, an Ag alloy, Au, Al, or Cu.

A thickness of the reflection layer 15 is not particularly limited, but ranges from 0.1 $\mu$m to 2.0 $\mu$m inclusive, for example, and preferably ranges from 0.3 $\mu$m to 1.0 $\mu$m inclusive.

(Insulating Layer 17)

The infrared LED element 1 shown in FIG. 1 includes an insulating layer 17 formed on top of the reflection layer 15. The insulating layer 17 is made of a material that displays electrical insulation and that has high transparency to the infrared light L. Transmittance of the insulating layer 17 to the infrared light L is preferably 70% or higher, more preferably 80% or higher, and particularly preferably 90% or higher. In case the peak wavelength of the infrared light L ranges from 1000 nm to 2000 nm inclusive, the insulating layer 17 can be made of a material such as $SiO_2$, SiN, or $Al_2O_3$.

(Semiconductor Layer 20)

The infrared LED element 1 shown in FIG. 1 includes the semiconductor layer 20 formed on top of the insulating layer 17. The semiconductor layer 20 is a laminate made up of a plurality of layers. Specifically, the semiconductor layer 20 includes a contact layer 21, a first cladding layer 23, the active layer 25, and a second cladding layer 27.

In the present embodiment, the contact layer 21 is made of p-type $Ga_xIn_{1-x}As_yP_{1-y}$ ($0 \leq x < 0.33$, $0 \leq y < 0.70$). In other words, in the present embodiment, a "first conduction type" is a p-type. Details of a composition of the contact layer 21 will be described later. A thickness of the contact layer 21 is not limited, but ranges from 10 nm to 1000 nm inclusive, for example, and preferably ranges from 50 nm to 500 nm inclusive. A concentration of a p-type dopant in the contact layer 21 preferably ranges from $5 \times 10^{17}/cm^3$ to $3 \times 10^{19}/cm^3$ inclusive and more preferably ranges from $1 \times 10^{18}/cm^3$ to $2 \times 10^{9}/cm^3$ inclusive.

In the present embodiment, the first cladding layer 23 is formed on top of the contact layer 21 and is made of p-type InP. A thickness of the first cladding layer 23 is not limited, but ranges from 1000 nm to 10000 nm inclusive, for example, and preferably ranges from 2000 nm to 5000 nm inclusive. A concentration of a p-type dopant in the first cladding layer 23, in a place apart from the active layer 25, preferably ranges from $1 \times 10^{17}/cm^3$ to $3 \times 10^{18}/cm^3$ inclusive and more preferably ranges from $5 \times 10^{17}/cm^3$ to $3 \times 10^{18}/cm^3$ inclusive.

A material such as Zn, Mg, or Be can be used as the p-type dopant contained in the contact layer 21 and the first cladding layer 23. The material is preferably Zn or Mg and particularly preferably Zn.

In the present embodiment, the active layer 25 is a semiconductor layer formed on top of the first cladding layer 23. A material for the active layer 25 is selected appropriately from ones that can generate light having a target wavelength and epitaxially grow by being lattice matched to the growth substrate 3 made of InP. For instance, the active layer 25 may have a single-layer structure of GaInAsP. AlGaInAs, or InGaAs, or may have a multiple quantum well (MQW) structure that includes a well layer made of GaInAsP, AlGaInAs, or InGaAs and a barrier layer made of GaInAsP, AlGaInAs, InGaAs, or InP that provides greater band gap energy than the well layer does.

A film thickness of the active layer 25 that has the single-layer structure ranges from 50 nm to 2000 nm inclusive and preferably ranges from 100 nm to 300 nm inclusive. When the active layer 25 has the MQW structure, the well layer and the barrier layer that each have a film thickness of 5 nm to 20 nm inclusive are laminated in a range of 2 cycles to 50 cycles inclusive.

The active layer 25 may be doped with an n-type or p-type dopant or may be undoped. If the active layer is doped with an n-type dopant, Si, for example, can be used as the dopant.

In the present embodiment, the second cladding layer 27 is formed on top of the active layer 25 and is made of n-type InP. In other words, in the present embodiment, a "second conduction type" is an n-type. A thickness of the second cladding layer 27 is not limited, but ranges from 100 nm to 10000 nm inclusive, for example, and preferably ranges from 500 nm to 5000 nm inclusive. A concentration of an n-type dopant in the second cladding layer 27 preferably ranges from $1 \times 10^{17}/cm^3$ to $5 \times 10^{18}/cm^3$ inclusive and more preferably ranges from $5 \times 10^{17}/cm^3$ to $4 \times 10^{18}/cm^3$ inclusive. An n-type impurity with which the second cladding layer 27 is doped can be a substance such as Sn, Si, S. Ge, or Se. The n-type impurity is particularly preferably Si.

A material for the first and the second cladding layers 23 and 27 is selected appropriately from ones that do not absorb the infrared light L generated in the active layer 25 and that can epitaxially grow by being lattice matched to the growth substrate 3 (refer to FIG. 2A described later) made of InP.

For instance, the first and the second cladding layers 23 and 27 can be made of a material, such as GaInAsP and AlGaInAs, as well as InP.

In an example shown in FIG. 1, asperities 27a are formed on a surface on the +Y side of the second cladding layer 27. With the asperities 27a formed, an amount of the infrared light L (L1, L2) reflected off the surface of the second cladding layer 27 toward the active layer 25 after traveling from the active layer 25 in the +Y direction decreases, and the light extraction efficiency increases. However, in the present invention, the surface of the second cladding layer 27 may or may not have the asperities 27a.

(First Electrode 31)

The infrared LED element 1 shown in FIG. 1 includes a first electrode 31 that is formed at each of a plurality of places in the insulating layer 17 by passing through the insulating layer 17 in the Y direction (corresponding to a "first direction"). The first electrode 31 connects the contact layer 21 formed on the +Y side of the insulating layer 17 to the reflection layer 15 formed on the −Y side of the insulating layer 17.

The first electrode 31 is made of a material that allows an ohmic contact to the contact layer 21. In one example, the first electrode 31 is made of a material such as Au/Zn/Au, AuZn, or AuBe. The first electrode may include a plurality of kinds out of these materials. These materials display low reflectance to the infrared light L compared to the material that the reflection layer 15 is made of.

Any pattern may be formed by the first electrodes 31 when viewed in the Y direction. However, from the viewpoint of allowing a flow of an electric current across a wide area inside the active layer 25 in a direction (hereinafter referred to as a "surface direction") parallel to a main surface of the support substrate 11 (an XZ plane), the first electrodes 31 are preferably disposed at a plurality of places that are dispersed in the surface direction.

A gross area of all the first electrodes 31 when viewed in the Y direction is preferably 30% or lower, more preferably 20% or lower, and particularly preferably 15% or lower relative to an area of the semiconductor layer 20 (e.g., the active layer 25) in the surface direction. If the gross area of the first electrodes 31 is relatively large, the infrared light L2 traveling from the active layer 25 toward the support substrate 11 (in the −Y direction) is absorbed by the first electrodes 31, and the extraction efficiency decreases. On the other hand, if the gross area of the first electrodes 31 is too small, a resistance value increases and a forward voltage rises.

(Second Electrode 32)

The infrared LED element 1 shown in FIG. 1 includes a second electrode 32 formed on top of the second cladding layer 27. Preferably, the second electrode 32 when viewed in the Y direction is formed to extend in a grid shape on top of the second cladding layer 27. This enables an electric current flowing in the active layer 25 to expand in the surface direction and thus enables light emission in a wide area inside the active layer 25. However, in the present invention, any pattern may be formed by the second electrode 32.

In one example, the second electrode 32 is made of a material such as Au/Zn/Au, AuZn, or AuBe. The second electrode may include a plurality of kinds out of these materials.

(Back Electrode 33)

The infrared LED element 1 shown in FIG. 1 includes a back electrode 33 formed on a surface (the −Y side) of the support substrate 11 opposite the semiconductor layer 20. The back electrode 33 provides an ohmic contact to the support substrate 11. In one example, the back electrode 33 is made of a material such as AuGe/Ni/Au, Pt/Ti, or Ge/Pt. The back electrode may include a plurality of kinds out of these materials.

[Method of Manufacturing]

With reference to FIGS. 2A to 2F, an example of a method of manufacturing the infrared LED element 1 will be described. FIGS. 2A to 2F are each a cross-sectional view showing a step in a manufacturing process.

(Step S1)

Figure 2A:
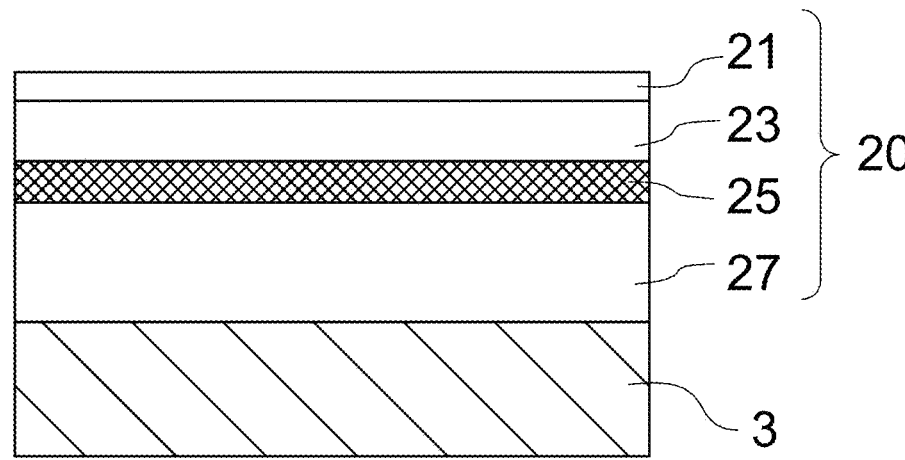
FIG. 2A is a cross-sectional view for illustrating a step in a method of manufacturing the infrared LED element shown in FIG. 1.
Figure 2B:
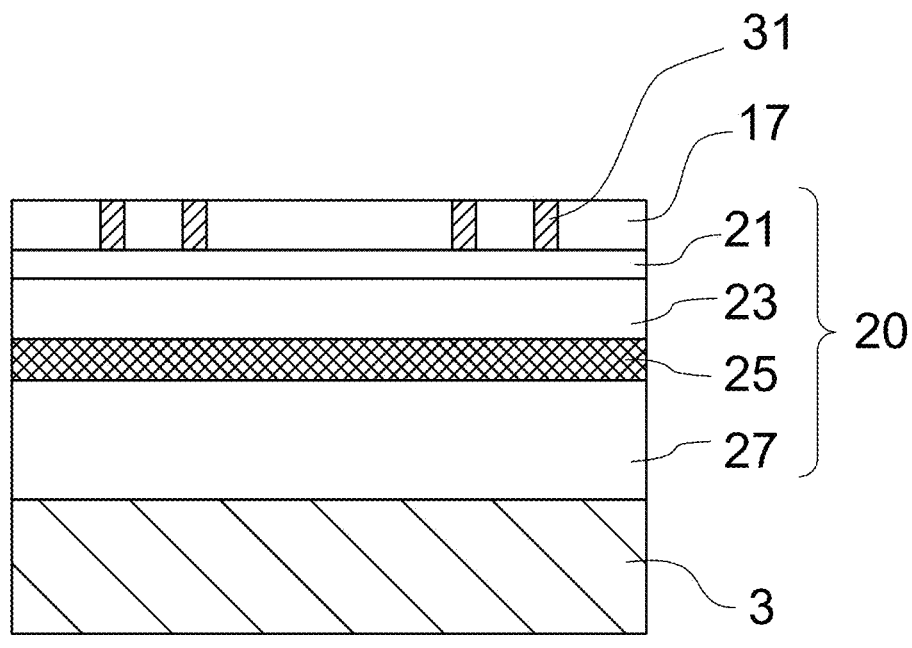
FIG. 2B is a cross-sectional view for illustrating a step in the method of manufacturing the infrared LED element shown in FIG. 1.

As shown in FIG. 2A, the growth substrate 3 made of InP is conveyed into a metal organic chemical vapor deposition (MOCVD) apparatus, and the second cladding layer 27, the active layer 25, the first cladding layer 23, and the contact layer 21 are epitaxially grown in sequence on the growth substrate 3 to form the semiconductor layer 20. In step S1, a type and a flow rate of a material gas, treatment time, environmental temperature, and other conditions are appropriately adjusted depending on the material for the grown layer and the film thickness. Examples of the materials for the layers of the semiconductor layer 20 are as described above. In particular, growth conditions for the contact layer 21 are adjusted to meet $Ga_xIn_{1-x}As_yP_{1-y}$ ($0 \leq x < 0.33$, $0 \leq y < 0.70$).

(Step S2)

The epitaxial wafer is removed from the MOCVD apparatus, and a photoresist mask patterned by a photolithography technique is formed on a surface of the contact layer 21. After that, a material (e.g., AuZn) for forming the first electrodes 31 is deposited using a vacuum deposition device and then the photoresist mask is peeled off by a lift-off technique. After that, alloy treatment (annealing treatment) is performed, for example, through a heating process at 450° C. for 10 minutes to provide an ohmic contact between the contact layer 21 and the first electrodes 31.

Next, the insulating layer 17 made of $SiO_2$, for example, is deposited by a plasma-enhanced chemical vapor deposition (CVD) technique. After that, a part of the insulating layer 17 located above the first electrodes 31 is removed by the photolithography technique and an etching technique to cause the first electrodes 31 to be exposed (refer to FIG. 2B).

(Step S3)

Figure 2C:
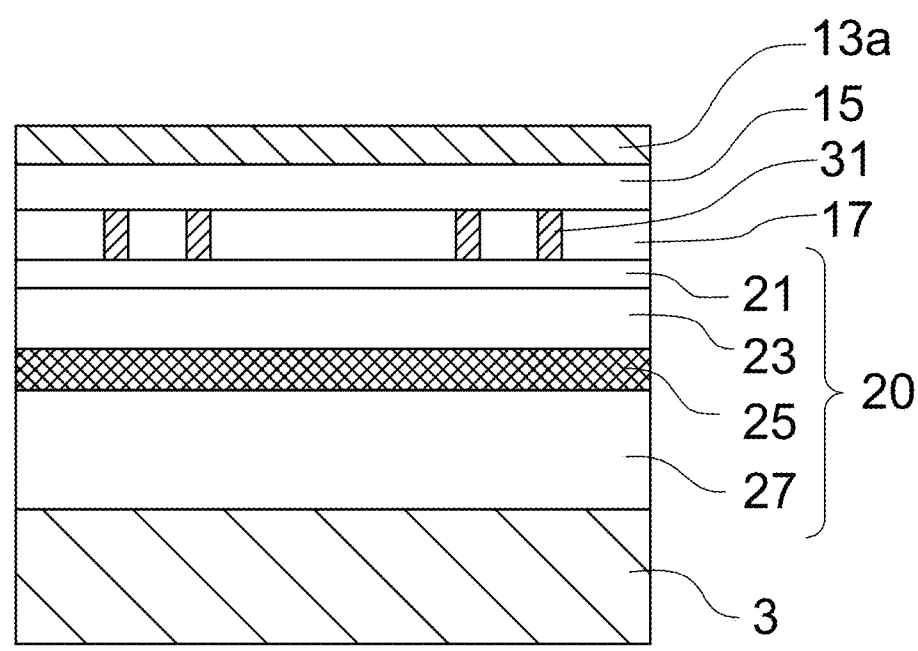
FIG. 2C is a cross-sectional view for illustrating a step in the method of manufacturing the infrared LED element shown in FIG. 1.

As shown in FIG. 2C, a joining layer 13a made of Au—Sn, for example, is formed to cover the insulating layer 17 and the first electrodes 31. The joining layer 13a may be made of a material identical to that for the joining layer 13.

(Step S4)

Figure 2D:
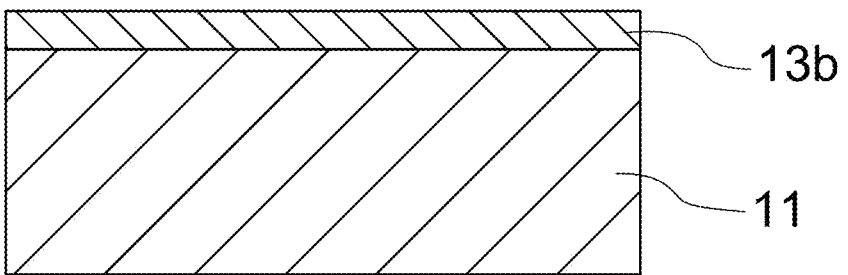
FIG. 2D is a cross-sectional view for illustrating a step in the method of manufacturing the infrared LED element shown in FIG. 1.

As shown in FIG. 2D, the support substrate 11 separate from the growth substrate 3 is prepared, and a joining layer 13b made of Au—Sn, for example, is formed on an upper surface of the support substrate 11. Although not shown, a metal layer (e.g., Ti) for contact use may be formed on the surface of the support substrate 11, and the joining layer 13b may be formed on top of the metal layer.

(Step S5)

Figure 2E:
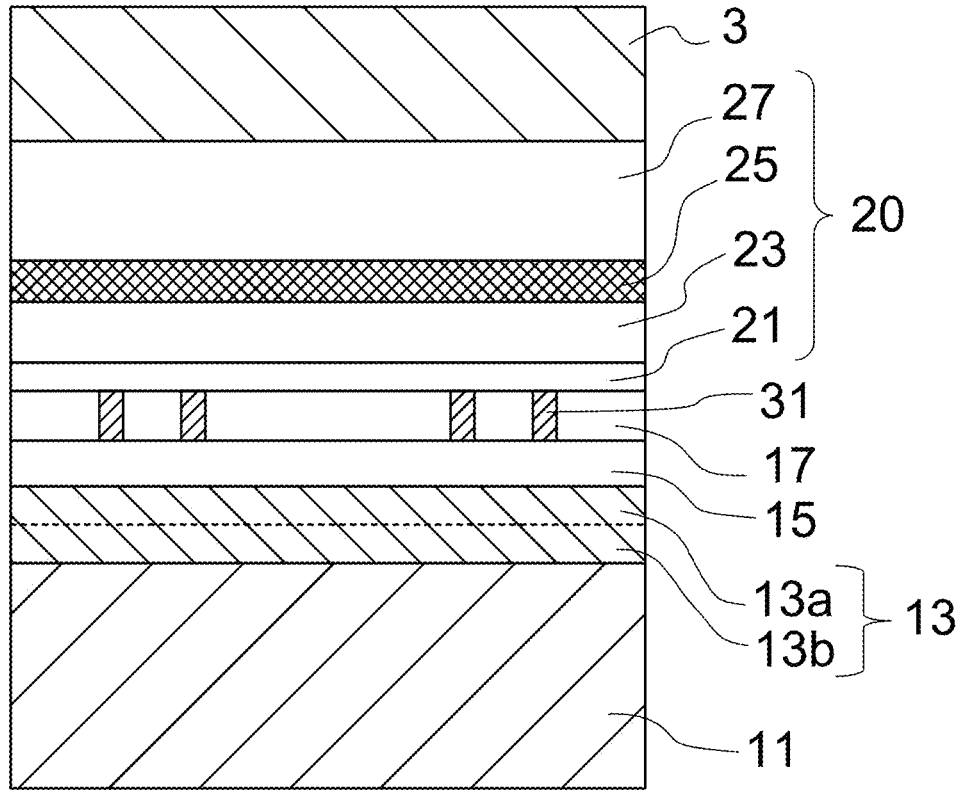
FIG. 2E is a cross-sectional view for illustrating a step in the method of manufacturing the infrared LED element shown in FIG. 1.
Figure 2F:
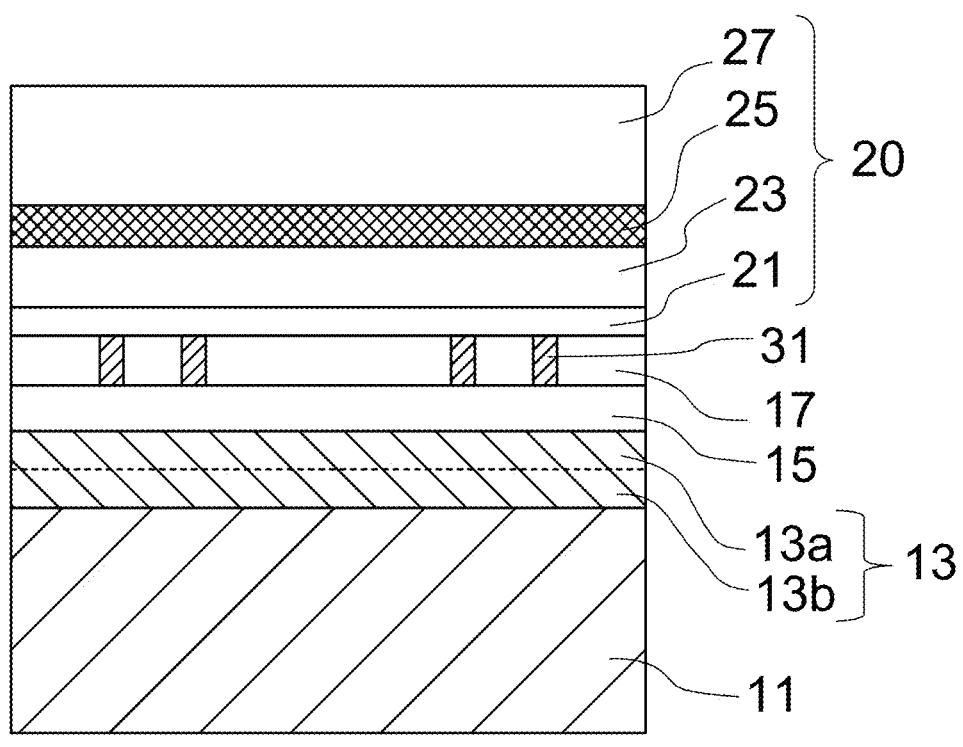
FIG. 2F is a cross-sectional view for illustrating a step in the method of manufacturing the infrared LED element shown in FIG. 1.

As shown in FIG. 2E, the growth substrate 3 and the support substrate 11 are bonded together through the joining layer 13 (13a, 13b), for example, at a temperature of 280° C. and a pressure of 1 MPa. Through this process, the joining layer 3a on top of the growth substrate 3 and the joining layer 13b on top of the support substrate 11 are melted and integrated together (the joining layer 13).

(Step S6)

After a resist is applied to a surface of a side of the semiconductor layer 20 to protect the semiconductor layer, the exposed growth substrate 3 is ground and polished or is wet-etched by a hydrochloric acid based etchant. By this process, the growth substrate 3 is peeled off and the second cladding layer 27 is exposed (refer to FIG. 2F).

(Step S7)

A material (e.g., AuGe/Ni/Au) for forming the second electrode 32 is deposited on the surface of the exposed second cladding layer 27 using a vacuum deposition device, and then alloy treatment (annealing treatment) is performed, for example, through a heating process at 450° C. for 10 minutes to form the second electrode 32 (refer to FIG. 1).

(Step S8)

Next, wet etching is applied to the surface of the second cladding layer 27 on which the second electrode 32 is not formed, and the asperities 27*a* are formed. After that, mesa etching is applied to separate the wafer into each element. Specifically, wet etching treatment is performed by a mixed solution of bromine and methanol, with a non-etching region on the surface of the second cladding layer 27 being masked by a resist that is patterned by the photolithography technique. As a result, a part of the semiconductor layer 20 located in an unmasked region is removed (refer to FIG. 1).

(Step S9)

Next, a material (e.g., Ti/Au) for forming the back electrode 33 is deposited on the surface on the −Y side of the support substrate 11 using a vacuum deposition device to form the back electrode 33. As a result, the infrared LED element 1 shown in FIG. 1 is manufactured.

The order of steps S7, S8, and S9 may be appropriately changed. The order of the other steps may also be appropriately inverted with proviso that the inverted order is within a range that does not influence manufacturing of the infrared LED element 1.

[Verification]

A plurality of kinds of the infrared LED elements 1 was manufactured in accordance with steps S1 to S9 above with only the compositions of the contact layers 21 being varied, and voltages were applied to the infrared LED elements to cause light emission. The applied voltages were adjusted such that electric currents flowing to the infrared LED elements 1 were 50 mA.

Figure 3A:
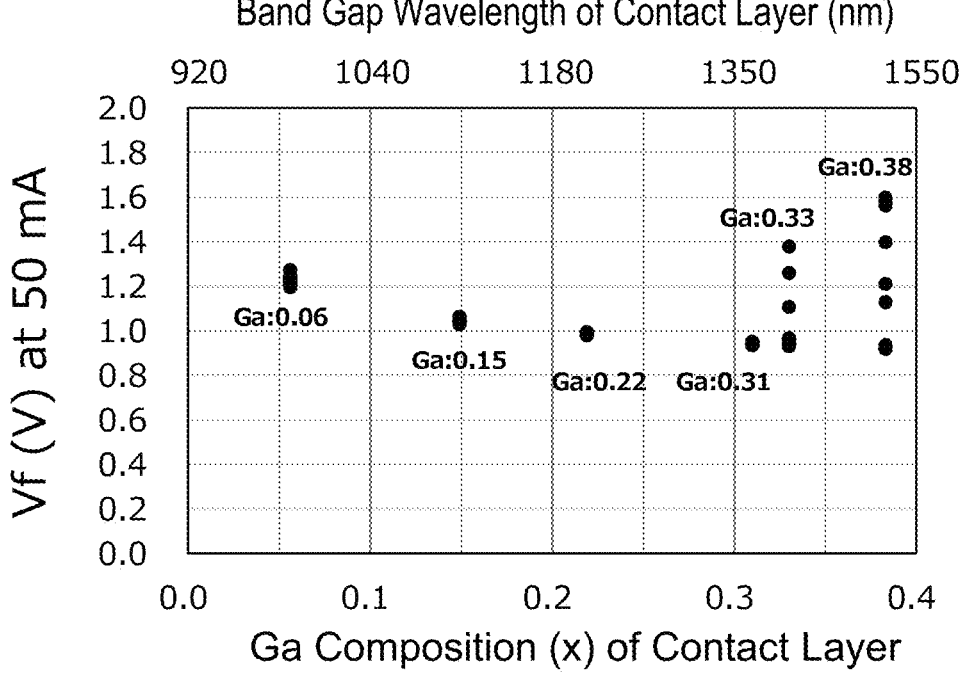
FIG. 3A is a graph showing a relationship between a Ga composition (an x value) of a contact layer made of $Ga_xIn_{1-x}As_yP_{1-y}$ and a forward voltage Vf of an infrared LED element 1.

FIG. 3A is a graph showing a relationship between the Ga composition (an x value) of the contact layer 21 made of $Ga_xIn_{1-x}As_yP_{1-y}$ and a forward voltage Vf of the infrared LED element 1. A plurality of the infrared LED elements 1 with the identical Ga composition (an x value) was also made to measure the forward voltages Vf of the infrared LED elements.

Figure 3B:
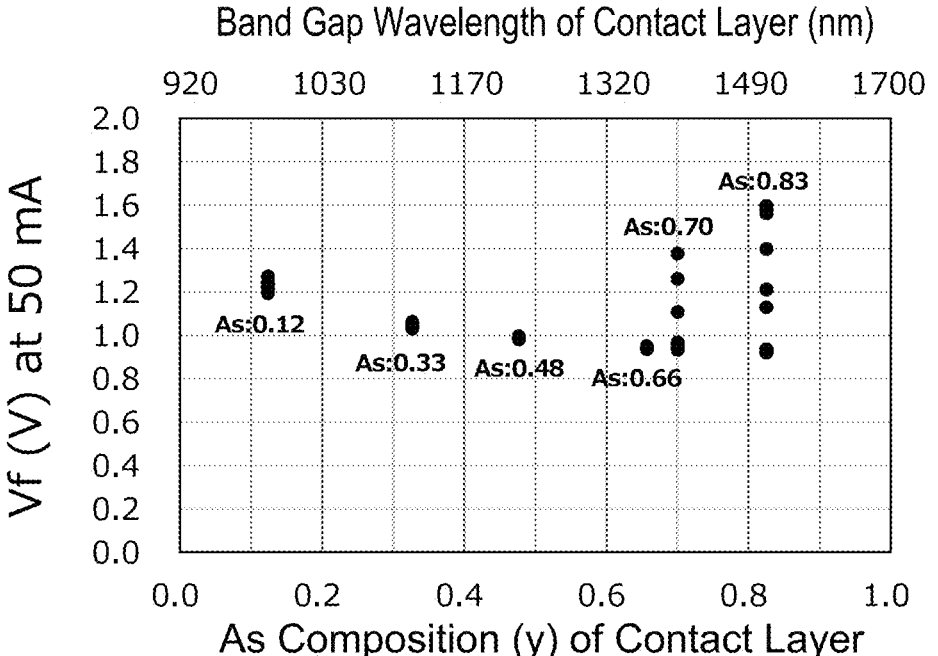
FIG. 3B is a graph showing a relationship between an As composition (ay value) of a contact layer made of $Ga_xIn_{1-x}As_yP_{1-y}$ and a forward voltage Vf of an infrared LED element 1.

The contact layer 21 is required to epitaxially grow on the growth substrate 3 made of InP and thus needs to be lattice matched to InP. For this reason, when the Ga composition (the x value) of the contact layer 21 is changed, an As composition (a y value) of the contact layer 21 is also inevitably changed. More specifically, when the Ga composition (the x value) is increased, the As composition (the y value) needs to be increased to enable the contact layer to be lattice matched to InP. With this in view, regarding the infrared LED elements 1 made for verification in FIG. 3A. FIG. 3B is a graph showing a relationship between the As composition (the y value) of the contact layer 21 and the forward voltage Vf of the infrared LED element 1. In FIGS. 3A and 3B, the upper horizontal axis indicates a band gap wavelength (absorption edge wavelength) of the contact layer 21 determined by the corresponding Ga composition (the x value) and the As composition (the y value) for reference purposes.

When the contact layer 21 of the infrared LED elements had a Ga composition of 0.06, the As composition was 0.12. In other words, the infrared LED elements plotted at a place for the Ga composition 0.06 in FIG. 3A and the infrared LED elements plotted at a place for the As composition 0.12 in FIG. 3B are identical to each other.

The following is a description of only correspondences between the Ga composition and the As composition.

When the contact layer 21 of the infrared LED elements had a Ga composition of 0.15, the As composition was 0.33.

When the contact layer 21 of the infrared LED elements had a Ga composition of 0.22, the As composition was 0.48.

When the contact layer 21 of the infrared LED elements had a Ga composition of 0.31, the As composition was 0.66.

When the contact layer 21 of the infrared LED elements had a Ga composition of 0.33, the As composition was 0.70.

When the contact layer 21 of the infrared LED elements had a Ga composition of 0.38, the As composition was 0.83.

According to FIG. 3A, there is not much variation in forward voltage Vf between the infrared LED elements 1 when the Ga composition of the contact layers 21 is in a range of 0.31 or less (when the As composition is in a range of 0.66 or less). On the other hand, marked variation is observed in forward voltage Vf between the infrared LED elements 1 when the Ga composition of the contact layers 21 is in a range of 0.33 or more (when the As composition is in a range of 0.70 or more). The results demonstrate that it is preferred, from the viewpoint of reducing variation in forward voltage Vf, that the Ga composition of the contact layers 21 be less than 0.33 and the As composition be less than 0.70.

Figure 4A:
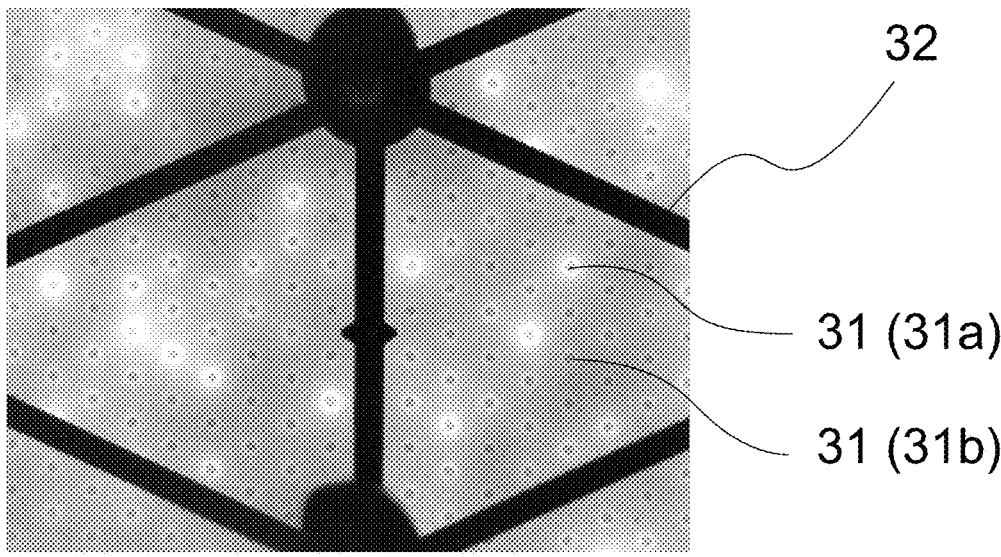
FIG. 4A is a photograph of a light-emission pattern of an infrared LED element imaged by an infrared camera on condition that the infrared LED element is manufactured with the Ga composition of a contact layer made of $Ga_xIn_{1-x}As_yP_{1-y}$ being set to 0.38.
Figure 4B:
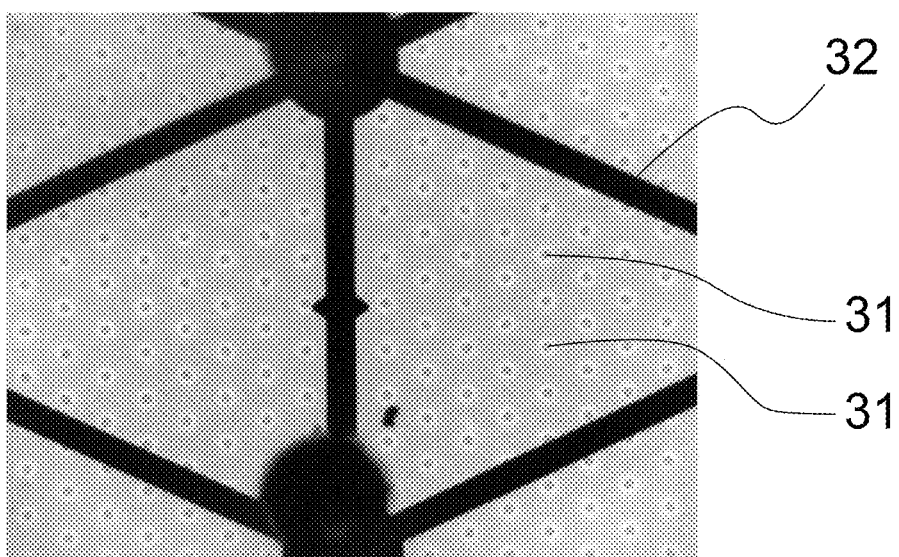
FIG. 4B is a photograph of a light-emission pattern of an infrared LED element imaged by an infrared camera on condition that the infrared LED element is manufactured with the Ga composition of a contact layer made of $Ga_xIn_{1-x}As_yP_{1-y}$ being set to 0.15.

FIG. 4A is a photograph taken by an infrared camera from the light extraction surface side (the second cladding layer 27 side) of a light-emission pattern of the infrared LED element 1 manufactured with the Ga composition of the contact layer 21 being set to 0.38 when a voltage is applied to it. FIG. 4B is a photograph taken by the method above in a case of the infrared LED element 1 that is manufactured with the Ga composition of the contact layer 21 being set to 0.15.

According to FIG. 4A, when the Ga composition of the contact layer 21 is 0.38, there are regions with high and low emission intensities, and occurrence of uneven light emission in the surface direction is observed. Meanwhile, according to FIG. 4B, when the Ga composition of the contact layer 21 is 0.15, light is emitted uniformly in the surface direction, and uneven light emission is not observed.

According to results in FIGS. 3A and 4A, when the Ga composition of the contact layer 21 is 0.38, uneven light emission is observed, and variation occurs in forward voltage Vf. Hence, it is estimated that when the Ga composition of the contact layer 21 was 0.38, variation occurred in contact resistance between the plurality of the first electrodes 31 disposed in the surface direction and the contact layer 21. Due to occurrence of the variation in contact resistance, there were ones into which a relatively high electric current flowed (reference numeral 31*a* in FIG. 4A) and others into which an electric current barely flowed (reference numeral 31*b* in FIG. 4A) among the plurality of the first electrodes 31. Consequently, it is considered that while the emission intensity increased at a place near the former first electrode 31 (31*a*), the emission intensity decreased at a place near the latter first electrode 31 (31*b*), and uneven light emission occurred in the surface direction.

According to results in FIGS. 3A and 4B, when the Ga composition of the contact layer 21 is 0.15, variation does not occur in forward voltage Vf and uneven light emission is not observed. Hence, it is considered that w % ben the Ga composition of the contact layer 21 was 0.15, variation did not occur in contact resistance between the first electrodes 31 and the contact layer 21.

When results in FIG. 3A are taken into account, it is found that when the Ga composition of the contact layer 21 is less than 0.33, the infrared LED elements 1 can reduce light emission variation in the surface direction. As described above, when the contact layer 21 is made of $Ga_xIn_{1-x}As_yP_{1-y}$, the As composition is determined once the Ga composition is fixed from the viewpoint of lattice matching. In other words, w % ben results in FIGS. 3A and 3B are taken into account, it is found that when the Ga composition of the contact layer 21 is less than 0.33 and the As composition is less than 0.70, the infrared LED elements 1 can reduce light emission variation in the surface direction.

The reason why the variation in contact resistance is reduced when the Ga composition of the contact layer 21 made of $Ga_xIn_{1-x}As_yP_{1-y}$ is less than 0.33 is not certain, but the inventors of the present invention have conjectured as follows. As described above, in step S2, an annealing treatment is performed to provide an ohmic contact between the contact layer 21 and the first electrodes 31. The ohmic contact is provided when the first electrodes 31 and the contact layer 21 are rendered in an alloy, and it is conjectured that an increased composition of Ga and As, materials for forming the contact layer 21, could cause the alloying reaction to being unstable.

Figure 5:
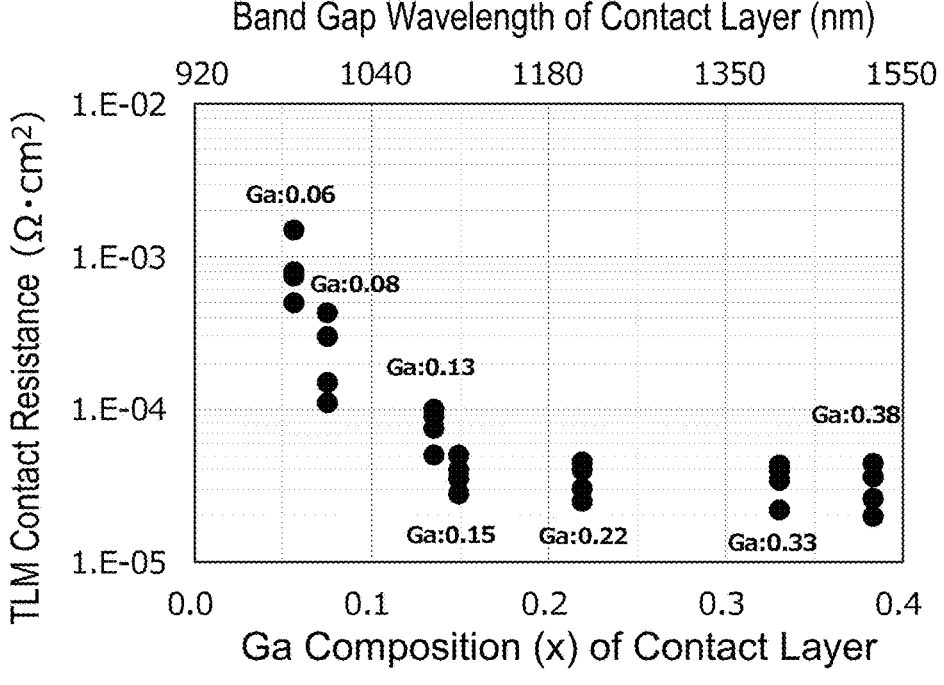
FIG. 5 is a graph showing a relationship between contact resistance and Ga composition, the contact resistance being measured by a TLM technique using an inspection electrode pattern on contact layers that have varied Ga compositions.

FIG. 5 is a graph showing the results of measured contact resistance in relation to Ga composition, the contact resistance being measured by a transmission line model (TLM) technique using an inspection electrode pattern on the contact layers 21 that are the uppermost tier of semiconductor layers 20 made with varied Ga compositions in step S1.

The contact resistance shown in FIG. 5 is substantially different from the contact resistance between the first electrodes 31 and the contact layer 21 in the infrared LED element 1. This is because, in a case of the method of measurement by the TLM technique using the electrode pattern, an area of contact between the contact layer 21 and the TLM pattern is extremely large (e.g., 100 μm to 200 μm square), whereas an area of contact between the first electrodes 31 and the contact layer 21 is small due to an extremely small diameter (e.g., around dia. 5 μm to 15 μm) of each of the first electrodes. For this reason, the term "TLM contact resistance" is added to FIG. 5 to distinguish from the contact resistance in the infrared LED element 1, and the same term is used in the description given hereinafter.

It should be noted that due to the extremely small diameter of the first electrodes 31 as described above, measuring the real contact resistance between the first electrodes 31 and the contact layer 21 in the infrared LED element 1 is difficult in a practical manner.

Based on the results in FIG. 5, it is found that the TLM contact resistance rises with a decrease in the Ga composition of the contact layer 21. The results indicate that combined resistance of the contact resistance between the plurality of the first electrodes 31 and the contact layer 21 in the infrared LED element 1 shows a tendency to rise with a decrease in the Ga composition of the contact layer 21. In other words, it is found that as long as a problem of the variation in contact resistance between the first electrodes 31 and the contact layer 21 does not occur, the Ga composition of the contact layer 21 is preferably increased from the viewpoint of decreasing the forward voltage of the infrared LED element 1.

The results in FIG. 5 show that there is no significant difference between degrees of the variation in TLM contact resistance regardless of the value of the Ga composition of the contact layer 21. Conceivably, this is because of a large area of contact between the contact layer 21 and the TLM electrode pattern, and even if variation occurs in contact resistance in a microscopic region, such variation has little influence on the resistance value in a region of contact between the overall TLM electrode pattern and the contact layer 21.

In contrast, the diameter of the first electrodes 31 disposed in the actual infrared LED element 1 is small as described above, and thus variation in contact resistance in the microscopic region directly influences the contact resistance between the first electrodes 31 and the contact layer 21. This is described with reference to the photograph in FIG. 4A as follows. The contact resistance between the first electrode 31b at one place and the contact layer 21 is larger than the contact resistance between the first electrode 31a at another place and the contact layer 21, and this causes a difference in density of flowing electric current among these places.

In view of the results in FIG. 5, it is found that the Ga composition of the contact layer 21 is preferably in a range of more than 0.13 and less than 0.33, from the viewpoint of reducing the variation in contact resistance between the first electrodes 31 and the contact layer 21 and decreasing the forward voltage Vf. When the results in FIG. 3A are also taken into account, it is found that the Ga composition of the contact layer 21 preferably ranges from 0.14 to 0.31 inclusive.

Figure 6A:
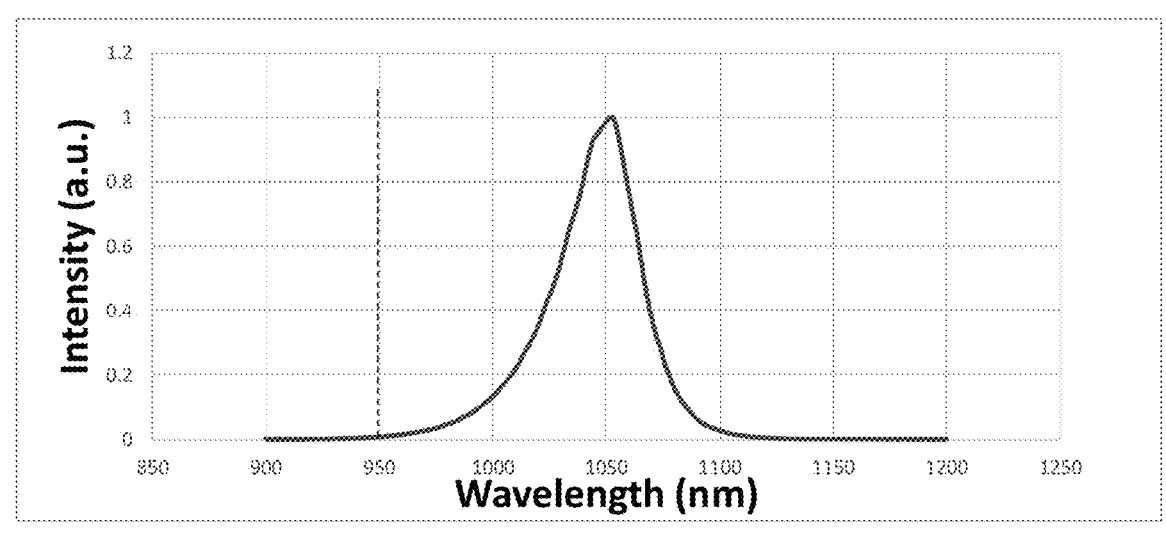
FIG. 6A shows an emission spectrum of an infrared LED element having a peak wavelength of 1050 nm.
Figure 6B:
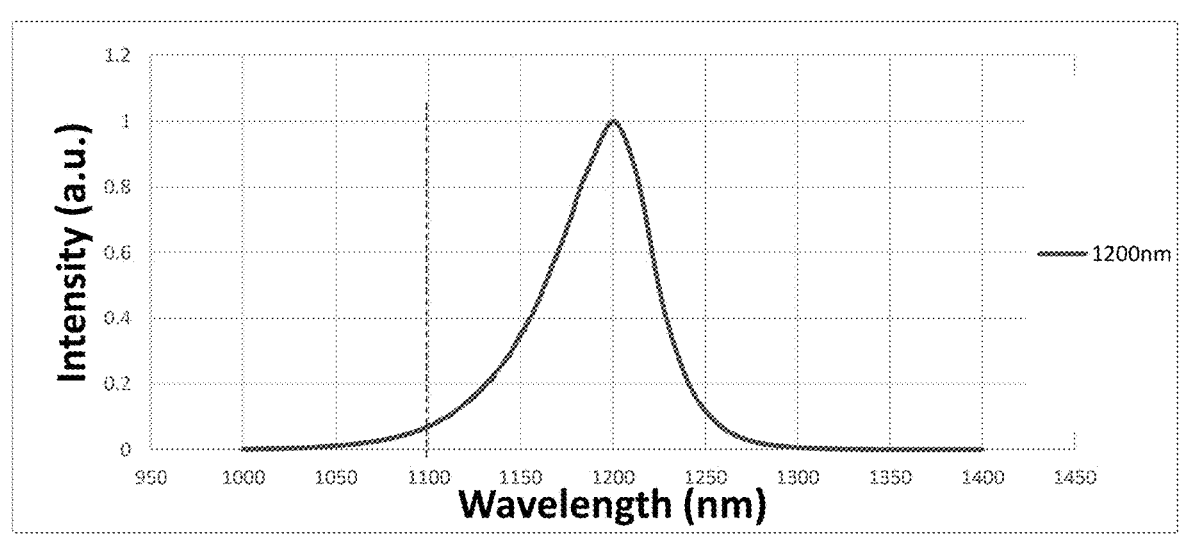
FIG. 6B shows an emission spectrum of an infrared LED element having a peak wavelength of 1200 nm.

Meanwhile, in response to a change in the Ga composition of the contact layer 21, an absorption edge wavelength $\lambda_0$ (a band gap wavelength) of the contact layer 21 shifts. If a peak wavelength $\lambda_L$ of the infrared light L and the absorption edge wavelength $\lambda_0$ of the contact layer 21 are close to each other, the contact layer 21 absorbs a large amount of the infrared light L, causing a decrease in light extraction efficiency. With this in view, it is preferred that the Ga composition of the contact layer 21 is set such that the absorption edge wavelength $\lambda_0$ of the contact layer 21 shifts to a short wavelength side by 100 nm or more relative to the peak wavelength $\lambda_L$ of the infrared light L. FIGS. 6A and 6B are examples of spectra of the infrared LED elements 1, respectively, manufactured in accordance with steps S1 to S9 above. The active layers 25 of the infrared LED elements 1 have different compositions and thus the peak wavelengths $\lambda_L$ of the infrared LED elements 1 are varied.

As shown in FIG. 6A, for the infrared LED element 1 with a peak wavelength $\lambda_L$ of 1050 nm, it is preferred that the Ga composition of the contact layer 21 is set such that the absorption edge wavelength $\lambda_0$ of the contact layer 21 is less than 950 nm. As shown in FIG. 6B, for the infrared LED element 1 with a peak wavelength $\lambda_L$ of 1200 nm, it is preferred that the Ga composition of the contact layer 21 is set such that the absorption edge wavelength $\lambda_0$ of the contact layer 21 is less than 1100 nm.

In other words, when the peak wavelength 4 is in a range of 1000 nm or more and less than 1200 nm, the Ga composition of the contact layer 21 is preferably less than 0.14. On the other hand, when the peak wavelength k ranges from 1200 nm to 2000 nm inclusive, the Ga composition of the contact layer 21 is preferably 0.14 or more and less than 0.33.

Another Embodiment

In the embodiment described above, the first conduction type is the p-type, and the second conduction type is the n-type. However, the conduction types may be reversed. In other words, in the infrared LED element 1 shown in FIG. 1, the contact layer 21 and the first cladding layer 23 may be of the n-type and the second cladding layer 27 may be of the p-type.

DESCRIPTION OF REFERENCE SIGNS

1 Infrared LED element
3 Growth substrate
11 Support substrate
13 Joining layer
13*a* Joining layer
13*b* Joining layer
15 Reflection layer
17 Insulating layer
20 Semiconductor layer
21 Contact layer
23 First cladding layer
25 Active layer
27 Second cladding layer
27*a* Asperities
31, 31*a*, 31*b* First electrode
32 Second electrode
33 Back electrode
L, L1, L2 Infrared light

The invention claimed is:

1. An infrared LED element having a peak wavelength in a range from 1000 nm to 2000 nm inclusive, the infrared LED element comprising:

a support substrate that exhibits electrical conductivity;

a reflection layer formed on top of the support substrate, the reflection layer being made of a metallic material;

an insulating layer formed on top of the reflection layer;

a contact layer formed on top of the insulating layer, the contact layer being made of $Ga_xIn_{1-x}As_yP_{1-y}$ of a first conduction type, where $0 \leq x < 0.33$ and $0 \leq y < 0.70$;

a first cladding layer of the first conduction type, the first cladding layer being formed on top of the contact layer;

an active layer formed on top of the first cladding layer;

a second cladding layer of a second conduction type different from the first conduction type, the second cladding layer being formed on top of the active layer;

a first electrode formed at each of a plurality of places in the insulating layer by passing through the insulating layer in a first direction orthogonal to a main surface of the support substrate, the first electrode connecting the contact layer to the reflection layer; and a second electrode formed on top of the second cladding layer, wherein the first electrode is made of a metallic material having a lower reflectance for light emitted from the active layer than the reflection layer, and the contact layer is in direct contact with the first electrode.

2. The infrared LED element according to claim 1, wherein a gross area of a zone throughout which the first electrode is formed at each of the plurality of the places is 30% or lower relative to an area of the active layer.

3. The infrared LED element according to claim 2, wherein the infrared LED element has a peak wavelength in a range of 1000 nm or more and less than 1200 nm, and the contact layer is made of $Ga_xIn_{1-x}As_yP_{1-y}$, where $0 \leq x < 0.14$ and $0 \leq y < 0.30$.

4. The infrared LED element according to claim 2, wherein the infrared LED element has a peak wavelength in a range from 1200 nm to 2000 nm inclusive, and the contact layer is made of $Ga_xIn_{1-x}As_yP_{1-y}$, where $0.14 \leq x < 0.33$ and $0.30 \leq y < 0.70$.

5. The infrared LED element according to claim 2, wherein an absorption edge wavelength of the contact layer is shorter than the peak wavelength by 100 nm or more.

6. The infrared LED element according to claim 2, wherein the first conduction type is a p-type, and the second conduction type is an n-type.

7. The infrared LED element according to claim 1, wherein the infrared LED element has a peak wavelength in a range of 1000 nm or more and less than 1200 nm, and the contact layer is made of $Ga_xIn_{1-x}As_yP_{1-y}$, where $0 \leq x < 0.14$ and $0 \leq y < 0.30$.

8. The infrared LED element according to claim 1, wherein the infrared LED element has a peak wavelength in a range from 1200 nm to 2000 nm inclusive, and the contact layer is made of $Ga_xIn_{1-x}As_yP_{1-y}$, where $0.14 \leq x < 0.33$ and $0.30 \leq y < 0.70$.

9. The infrared LED element according to claim 1, wherein an absorption edge wavelength of the contact layer is shorter than the peak wavelength by 100 nm or more.

10. The infrared LED element according to claim 1, wherein the first conduction type is a p-type, and the second conduction type is an n-type.

* * * * *